United States Patent [19]
Irons

[11] 4,327,486
[45] May 4, 1982

[54] METHOD OF MAKING A LAMP ASSEMBLY

[75] Inventor: Brian P. G. Irons, Heckley Heath, England

[73] Assignee: Lucas Industries Ltd., Birmingham, England

[21] Appl. No.: 148,050

[22] Filed: May 8, 1980

[30] Foreign Application Priority Data

May 25, 1979 [GB] United Kingdom ............... 18390/79

[51] Int. Cl.³ ............................................. H05K 3/02
[52] U.S. Cl. ........................................ 29/847; 29/857
[58] Field of Search ................. 29/846, 847, 831, 832, 29/853, 850, 857; 339/18 R, 18 C, 99 R, 99 L; 174/68.5

[56] References Cited
U.S. PATENT DOCUMENTS

| | | | |
|---|---|---|---|
| 3,114,194 | 12/1963 | Lohs | 29/850 |
| 3,295,189 | 1/1967 | Hammell | 29/857 |
| 3,377,698 | 4/1968 | Eick et al. | 29/850 |
| 3,544,950 | 12/1970 | Lopez et al. | 179/68.5 X |
| 3,981,076 | 9/1976 | Nicolas | |
| 4,065,850 | 1/1978 | Burr et al. | 29/853 |
| 4,129,939 | 12/1978 | Baldyga | 29/850 |

FOREIGN PATENT DOCUMENTS

| | | | |
|---|---|---|---|
| 52598 | 8/1974 | Australia | 174/68.5 |
| 2643574 | 3/1978 | Fed. Rep. of Germany . | |
| 1099797 | 1/1968 | United Kingdom | 174/68.5 |
| 1352558 | 5/1974 | United Kingdom | 174/68.5 |

Primary Examiner—Francis S. Husar
Assistant Examiner—Carl J. Arbes
Attorney, Agent, or Firm—Holman & Stern

[57] ABSTRACT

An electrically insulating base has five bulb holders and six electrical supply contacts secured thereto. The required electrical connections between the bulb holders and the contacts are made by securing a single piece of bared wire to all of the bulb holders and the contacts in the desired pattern and sequence, and then cutting the wire between those bulb holders and contacts where no connection is required in the desired electrical circuit(s). To hold the wire in the desired pattern, it is passed around guides on the base and engaged at wiring cross-over points with combined wire guides and supports. Over long runs the wire is supported by intermediate supports. This form of assembly lends itself to automatic wiring procedures and involves little wastage of material.

9 Claims, 6 Drawing Figures

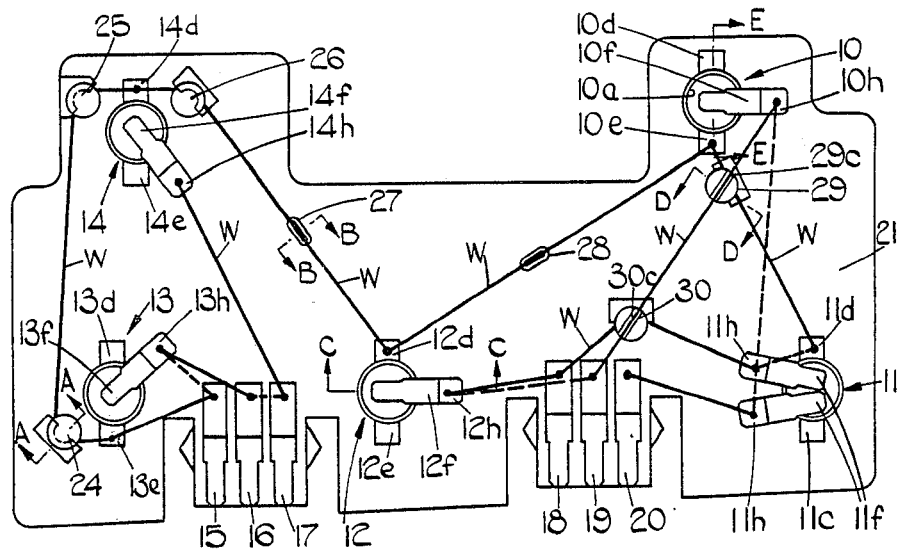
FIG.1.
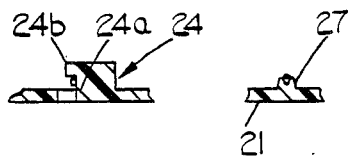 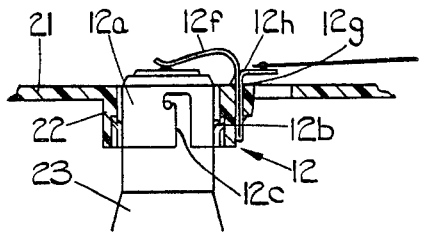
FIG.2. FIG.3. FIG.4.
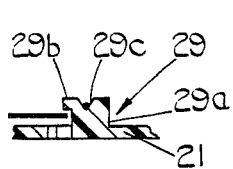 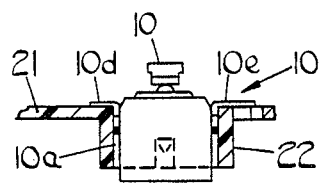
FIG.5. FIG.6.

METHOD OF MAKING A LAMP ASSEMBLY

This invention relates to a method of making a lamp assembly and is particularly, though not exclusively, concerned with a method of making a lamp assembly for use in a motor vehicle.

Lamp assemblies, particularly for use as rear lamp assemblies in motor vehicles, have previously been proposed in which the required electrical connection between a plurality of bulb holders arranged in a predetermined pattern on an electrically insulating base plate are connected with one or more electrical supply contacts by means of a stamped conductor pattern, i.e. a predetermined pattern of conductive strips formed by a stamping operation from an electrically conductive sheet. However, such a stamped conductor pattern is expensive in tooling costs so that it is expensive to re-tool for the production of a different stamped conductor pattern. Additionally, stamped conductor patterns have the disadvantage that a relatively large amount of wastage occurs in conductor material when stamping the conductor pattern from the electrically conductive sheet.

It is an object of the present invention to obviate or mitigate the above disadvantages.

According to the present invention there is provided a method of making a lamp assembly comprising providing a plurality of bulb holders and a plurality of electrical supply contacts in a predetermined arrangement on an electrically insulating base, wiring the bulb holders and contacts together in a predetermined pattern, and then removing those electrical wiring connections which are not required in the desired electrical circuit(s).

In this way, the only wastage which occurs is wastage arising from making electrical connections which are not actually required in the electrical circuit(s). Of course, the initial predetermined pattern of wiring can be arranged so as to minimise these unwanted electrical wiring connections consistent with maintaining a relatively simple original wiring pattern. With this form of arrangement, the wiring can be effected automatically by a programmable joining machine. The joint effected between the wiring and the bulb holders or contacts may be of any type to enable electrical connections, i.e. mechanical, welded, brazed or soldered joints.

Where the design of the lamp assembly dictates that one run of the wiring should cross over another, it is preferred to provide, on the base, a guide for the lower run of the wiring and a support or bridge for the upper run of the wiring.

If the design of the lamp assembly dictates a long run of the wiring between one electrical component and the next a wiring support may be provided on the base. In order to reduce the number of wiring runs crossing one another and to simplify the original predetermined pattern, it may be advantageous to provide one or more guide posts around which the wiring can be passed so as to maintain it in the desired position.

An embodiment of the present invention will now be described, by way of example, with reference to the accompanying drawing, in which:

FIG. 1 is a plan view of the rear of a vehicle rear-lamp assembly produced by the method according to the present invention;

FIG. 2 is a section on the line A—A of FIG. 1;

FIG. 3 is a section on the line B—B of FIG. 1;

FIG. 4 is a section on the line C—C of FIG. 1;

FIG. 5 is a section on the line D—D of FIG. 1, and

FIG. 6 is a section on the line E—E of FIG. 1.

The vehicle rear lamp assembly illustrated in the drawing comprises basically five bulb holders 10 to 14, and six electrical supply contacts 15 to 20 arranged in a predetermined pattern on an electrically insulating base 21. The base 21 is preferably formed of a plastics material by an injection moulding operation which produces integral sleeves 22 on the opposite side of the base 21 to that which is illustrated in FIG. 1. The construction of the bulb holders 10 to 14 is shown in greater detail with reference to bulb holder 12 which is shown in FIG. 4. Bulb holder 12 comprises a metal sleeve 12a having external barbs 12b which bite into the inner wall of the sleeve 22 to hold the metal sleeve 12a in position. The metal sleeve 12a is slotted as at 12c to provide a bayonet connection for a bulb 23. The metal sleeve 12a is provided at one end thereof with a pair of diametrically opposed, radially outwardly directed integral limbs 12d and 12e which lie on the surface of the base 21 remote from the sleeves 22. The bulb holder 12 further includes a resilient, blade-type centre contact 12f which is formed from a strip integrally with a limb 12h and an intermediate portion 12g. The intermediate portion 12g is defined by a doubled-over portion of the strip and includes a pair of spaced, integral locating barbs. The intermediate portion 12g extends through a slot provided in the base 26 adjacent the sleeve 22. The barbs hold the intermediate portion 12g in position by engaging the material of the base at respective ends of the slot. The centre contact 12f and the limb 12h are located at the opposite side of the base 21 to the sleeves 22.

The bulb holders 10, 11, 13 and 14 are similarly constructed and similar parts are accorded corresponding reference numerals. It will be seen, however, that the bulb holder 11 is provided with two centre contacts 11f and therefore two limbs 11h.

The supply contacts 15 to 20 are arranged in two sets of three and are engaged with the base 21 in a similar manner to that described with reference to the centre contact 12f.

Integrally formed to extend from that surface of the base 21 opposite to the surface from which the sleeves 22 extend, are three wire guides 24, 25 and 26, two wire supports 27 and 28, and two combined wire-guides-and-supports 29 and 30. The wire guides 24, 25 and 26 are substantially identical and wire guide 24 is typically shown in FIG. 2. Basically, the wire guide 24 comprises an upstanding cylindrical projection 24a of circular cross-section with a wire retaining lip 24b. The lip 24b is integral with and at the top of the projection 24a and extends part of the way around the projection 24a. The wire supports 27 and 28 are identical. Wire support 27 is shown in FIG. 3 and comprises an elongate projection haaving a wire receiving groove in its upper surface.

The combined wire-guide-and-supports 29 and 30 are substantially identical. The combined wire-guide-and-support 29 is shown in FIG. 5 and basically is the same as the wire guide 24 in that it comprises a projection 29a and a wire retaining lip 29b similar to the projection 24a and lip 24b, respectively. However, in addition to this, it is provided on its upper surface with a groove 29c.

In order to provide the required circuit pattern, the following connections are made using a single length of wire W. The wire is first anchored to limb 14h then led and anchored to contact 17 and from there to contact 16. From contact 16, the wire is secured to limb 13h and then to contact 15 from where it is led and secured to limb 13e and then passed around wire guides 24 and 25 to be secured to limb 14d. From limb 14d, the wire is led around the wire guide 26 and over the wire support 27 to be attached to limb 12d. From limb 12d, the wire is passed over wire support 28 and secured to limb 10e from whence it is taken via the combined wire-guide-and-support 29 to the limb 11d. From limb 11d, the wire is taken to the adjacent limb 11h and then to supply contact 18 after passing around the combined wire-guide-and support 30. From supply contact 18, the wire is taken to limb 12h and then back to supply contact 19 before passing through the grooves 30c and 29c to separate it from the wiring passing underneath. The wiring is then secured to limb 10h and then taken to the other limb 11h before being finally secured to supply contact 20 and then cut-off.

In addition to providing all of the connections necessary in the final circuits, the above-described wiring pattern also effects a number of connections which are not in fact required, i.e. which are short circuits. Thus, following the wiring operation, the connections between contacts 16 and 11d 17; limb 13h and contact 15; limb 10h and limb 11h; limbs 11d and 11h and limb 12h and contact 19 are severed. The wiring connections which remain in the final circuit are shown in full line in FIG. 1 whereas the wiring connections which are severed are shown in dotted line in FIG. 1.

In the above-described method, the wiring connections between the wire and the respective electrical components was effected by means of a soldering operation using a tool which has been programmed to move in a predetermined pattern. The electrical connections which were not required were removed manually subsequently. However, it is within the scope of the present invention to provide for manual wiring and/or automatic breaking of the unwanted connections. In the above-described embodiment, an un-insulated wire was used and the whole lamp assembly on the surface of the base 21 on which the wiring was provided was covered with a separately formed cover. However, it is within the scope of the present invention to provide a separate plastics foil to cover the whole lamp assembly or, alternatively, to spray or otherwise coat the parts requiring electrical insulation with a non-conductive paint or lacquer.

An an alternative to using a soldering operation, the wiring can be secured to the various electrical components by means of a welding operation, a brazing operation or by means of a mechanical joining operation, such as wrapping or engaging the wire in a wire-retaining groove or slot.

I claim:

1. A method of making a lamp assembly comprising the steps of:

providing a plurality of bulb holders and a plurality of electrical supply contacts in a predetermined arrangement on an electrically insulating base; and providing selective electrical wiring connections between the bulb holders and said supply contacts by providing a wiring pattern which includes at least one wiring arrangement in which one run of un-insulated wire crosses over another, the lower run of the crossed wire being engaged with a guide on the base and the upper run of the crossed wire being supported on a support means on the base so as to separate said upper and lower runs of the wire, and then removing those parts of said wiring pattern which are not required to provide the selective electrical wiring connections.

2. The method according to claim 1, wherein said wiring pattern is effected by securing a single length of un-insulated wire to all of said bulb holders and all of said contacts.

3. The method according to claim 1, including the step of spacing a run of the wiring between successive wiring connections from the insulating base by engaging said run of wiring with a support for the wiring.

4. The method according to claim 1 or 3, wherein said wiring step includes passing the wiring around at least one guide post in order to maintain said wiring in the desired position.

5. The method according to claim 1, wherein said guide and said support means are provided as a single formation on the base.

6. The method according to claim 1, including the further step of covering the wiring after the electrical connection removal step.

7. The method according to claim 6, wherein said covering step is effected by securing a previously formed cover over the wiring.

8. The method according to claim 6, wherein said covering step is effected by securing a plastics foil over the whole lamp assembly.

9. The method according to claim 6, wherein said covering step is effected by coating said wiring and any other parts requiring electrical insulation with an electrically insulating material.

* * * * *